US012598441B2

(12) United States Patent
Soma et al.

(10) Patent No.: US 12,598,441 B2
(45) Date of Patent: Apr. 7, 2026

(54) AUDIO SIGNAL PROCESSING METHOD AND AUDIO SIGNAL PROCESSING APPARATUS

(71) Applicant: YAMAHA CORPORATION, Hamamatsu (JP)

(72) Inventors: Keiichiro Soma, Hamamatsu (JP); Arata Imai, Hamamatsu (JP); Takeshi Nonaka, Hamamatsu (JP); Masaaki Okabayashi, Hamamatsu (JP); Yu Takahashi, Hamamatsu (JP); Kotaro Terada, Hamamatsu (JP); Kenji Ishizuka, Hamamatsu (JP)

(73) Assignee: YAMAHA CORPORATION, Hamamatsu (JP)

( * ) Notice: Subject to any disclaimer, the term of this patent is extended or adjusted under 35 U.S.C. 154(b) by 278 days.

(21) Appl. No.: 18/340,183

(22) Filed: Jun. 23, 2023

(65) Prior Publication Data

US 2024/0007815 A1 Jan. 4, 2024

(30) Foreign Application Priority Data

Jul. 1, 2022 (JP) ................................ 2022-106886

(51) Int. Cl.
*H04S 7/00* (2006.01)
*G06F 3/16* (2006.01)
(Continued)

(52) U.S. Cl.
CPC ................ *H04S 7/30* (2013.01); *G06F 3/165* (2013.01); *H03G 3/3005* (2013.01); *H04S 3/008* (2013.01);
(Continued)

(58) Field of Classification Search
None
See application file for complete search history.

(56) References Cited

U.S. PATENT DOCUMENTS 5,479,518 A 12/1995 Zampini
7,346,595 B2 * 3/2008 Aoyama .............. G05D 1/0221
                                                707/999.005
(Continued)

FOREIGN PATENT DOCUMENTS

EP        1551119 A2    7/2005
JP     H07182777 A     7/1995
(Continued)

OTHER PUBLICATIONS

Perez_Gonzalez et al. "Automatic Gain and Fader Control for Live Mixing." 2009 IEEE Workshop on Applications of Signal Processing to Audio and Acoustics. Oct. 18-21, 2009: 1-4.
(Continued)

*Primary Examiner* — Duc Nguyen
*Assistant Examiner* — Assad Mohammed
(74) *Attorney, Agent, or Firm* — ROSSI, KIMMS & McDOWELL LLP

(57) ABSTRACT

An audio signal processing method for a mixing apparatus including a plurality of channels, the audio signal processing method includes selecting at least a first channel among the plurality of channels, inputting an audio signal of the selected first channel, specifying setting data to be set to the mixing apparatus, based on time-series sound volume data for the first channel, or data on a second channel different from the first channel, among the plurality of channels, and outputting the specified setting data.

18 Claims, 9 Drawing Sheets

(51) Int. Cl.
H03G 3/30 (2006.01)
H04S 3/00 (2006.01)

(52) U.S. Cl.
CPC ......... H04S 7/40 (2013.01); H03G 2201/103
(2013.01); H04S 2400/01 (2013.01); H04S
2400/13 (2013.01)

(56) References Cited

U.S. PATENT DOCUMENTS

| | | | |
|---|---|---|---|
| 9,514,723 B2 * | 12/2016 | Silfvast | H04H 60/04 |
| 2006/0232586 A1 * | 10/2006 | Terada | G10H 1/46 |
| | | | 345/440 |
| 2007/0025568 A1 * | 2/2007 | Aiso | H04H 60/04 |
| | | | 381/119 |
| 2008/0049943 A1 | 2/2008 | Faller et al. | |
| 2013/0051207 A1 | 2/2013 | Yoshinari et al. | |
| 2016/0299677 A1 | 10/2016 | Terada | |
| 2019/0018642 A1 * | 1/2019 | Itoh | G06F 3/04883 |
| 2021/0241799 A1 | 8/2021 | Okabayashi | |
| 2022/0374139 A1 * | 11/2022 | Wehrman | G06F 3/04847 |
| 2023/0076123 A1 * | 3/2023 | Nakadai | H04R 1/406 |
| 2023/0333806 A1 * | 10/2023 | Sagawa | G10H 1/0091 |

FOREIGN PATENT DOCUMENTS

| | | | |
|---|---|---|---|
| JP | 2016201727 | A | 12/2016 |
| JP | 2017073631 | A | 4/2017 |
| JP | 2021125760 | A | 8/2021 |
| WO | 2021259725 | A1 | 12/2021 |

OTHER PUBLICATIONS

Moffat et al. "Machine Learning Multitrack Gain Mixing of Drums." Audio Engineering Society, 147th Convention. Convention e-Brief 527. Oct. 16-19, 2019: 1-7.

Extended European Search Report issued in European Appln. No. 23182361.8, mailed Dec. 12, 2023.

Office Action issued in European Appln. No. 23182361.8 mailed on Jul. 15, 2025.

Notice of Reasons for Refusal issued in Japanese Appln. No. 2022-106886 mailed Feb. 17, 2026. English machine translation provided.

* cited by examiner

PROCESSING P : START

S11

CPU 15 RECEIVES OPERATION
TO SELECT FIRST CHANNEL.

S12

CPU 15 RECEIVES INPUT OF
AUDIO SIGNAL OF FIRST CHANNEL.

S13

CPU 15 SPECIFIES SETTING DATA.

S14

CPU 15 OUTPUTS SETTING DATA.

END

| CH 1-8 | CH 9-16 | CH 17-24 | CH 25-32 |
|--------|---------|----------|----------|

| GAIN 0.0 | GAIN -5.8 | GAIN -5.8 | GAIN -5.8 | GAIN 0.0 | GAIN -5.8 | GAIN -5.8 | GAIN -5.8 |
|----------|-----------|-----------|-----------|----------|-----------|-----------|-----------|
| CH1 | CH2 | CH3 | CH4 | CH5 | CH6 | CH7 | CH8 |
| Vo | G1 | G2 | Bass | Vo | G1 | G2 | Bass |

AUDIO SIGNAL PROCESSING METHOD AND AUDIO SIGNAL PROCESSING APPARATUS

CROSS REFERENCE TO RELATED APPLICATIONS

This Nonprovisional application claims priority under 35 U.S.C. § 119(a) on Patent Application No. 2022-106886 filed in Japan on Jul. 1, 2022, the entire contents of which are hereby incorporated by reference.

BACKGROUND

Technical Field

An embodiment of the present disclosure relates to an audio signal processing method and an audio signal processing apparatus.

Background Information

Japanese Unexamined Patent Application Publication No. 2017-073631 discloses that analysis of sound to be emitted from a musical instrument estimates a type of the musical instrument and that an icon indicating an estimated musical instrument is displayed on a display of a tablet.

Japanese Unexamined Patent Application Publication No. 2021-125760 discloses a tablet and a microphone. The tablet identifies the type of a musical instrument by analyzing an audio signal inputted by the microphone.

Japanese Unexamined Patent Application Publication No. 2016-201727 discloses an equalizer setting device. The equalizer setting device displays in a graph a setting state of frequency characteristics in an equalizer. The equalizer setting device displays an element indicating a frequency range corresponding to a category set to a signal processing channel.

An audio signal processing method that is able to automatically obtain the same parameter as when an operator of a mixing apparatus manually adjusts a parameter, with a low computational load, or an audio signal processing method that is able to automatically obtain the same parameter as when a mixer engineer manually balances sound volume between channels is desired.

SUMMARY

An embodiment of the present disclosure is directed to provide an audio signal processing method that is able to automatically obtain the same parameter as when an operator of a mixing apparatus manually adjusts a parameter, with a low computational load, or an audio signal processing method that is able to automatically obtain the same parameter as when an operator of a mixing apparatus manually balances sound volume between channels.

An audio signal processing method for a mixing apparatus including a plurality of channels according to an embodiment of the present disclosure includes selecting at least a first channel among the plurality of channels, inputting an audio signal of the selected first channel, specifying setting data to be set to the mixing apparatus, based on time-series sound volume data on for the first channel, or data on a second channel different from the first channel, among the plurality of channels, and outputting the specified setting data.

An audio signal processing method according to an embodiment of the present disclosure is able to automatically obtain the same parameter as when an operator of a mixing apparatus manually adjusts a parameter, with a low computational load, or is able to automatically obtain the same parameter as when an operator of a mixing apparatus manually balances sound volume between channels.

BRIEF DESCRIPTION OF THE DRAWINGS

FIG. 1 is a block diagram showing a configuration of a mixing apparatus 1a.

FIG. 2 is a view showing an appearance of the mixing apparatus 1a.

FIG. 3 is a block diagram of signal processing to be executed by the mixing apparatus 1a.

FIG. 4 is a block diagram showing a processing configuration of an input patch 21a, an input channel 22a, a mixing bus 23a, an output channel 24a, and an output patch 25a.

FIG. 5 is a flow chart showing an example of processing of the mixing apparatus 1a.

FIG. 9 is a view showing an image displayed on a screen 16a of a mixing apparatus if according to a modification 1 of a second embodiment.

DETAILED DESCRIPTION

First Embodiment

Figure 1:
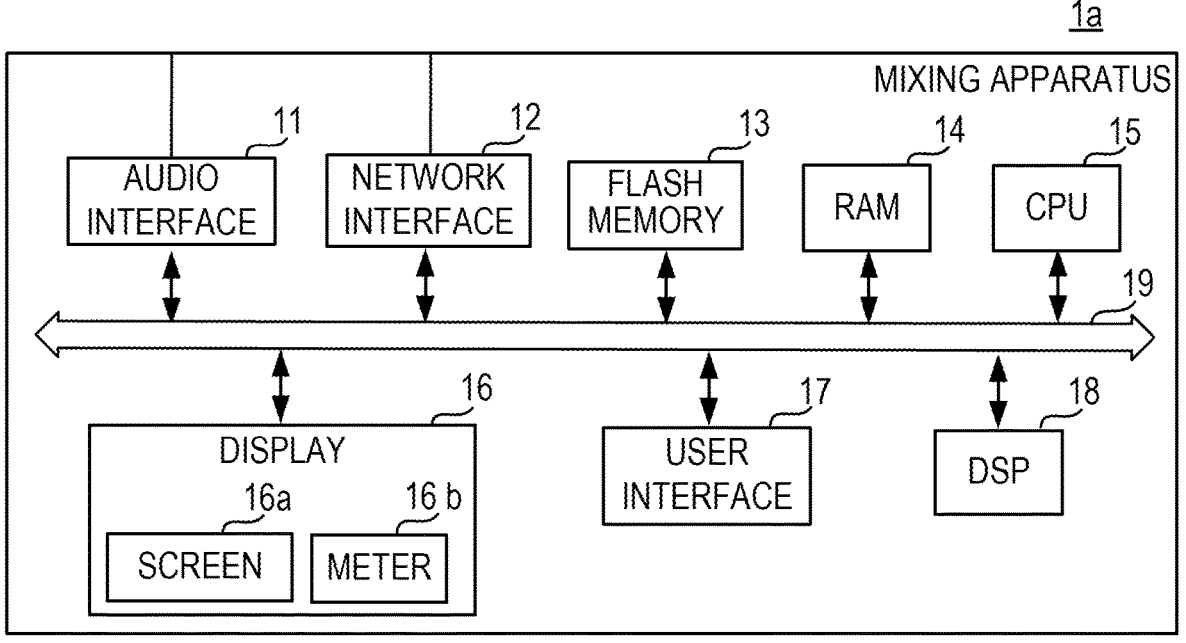
Figure 2:
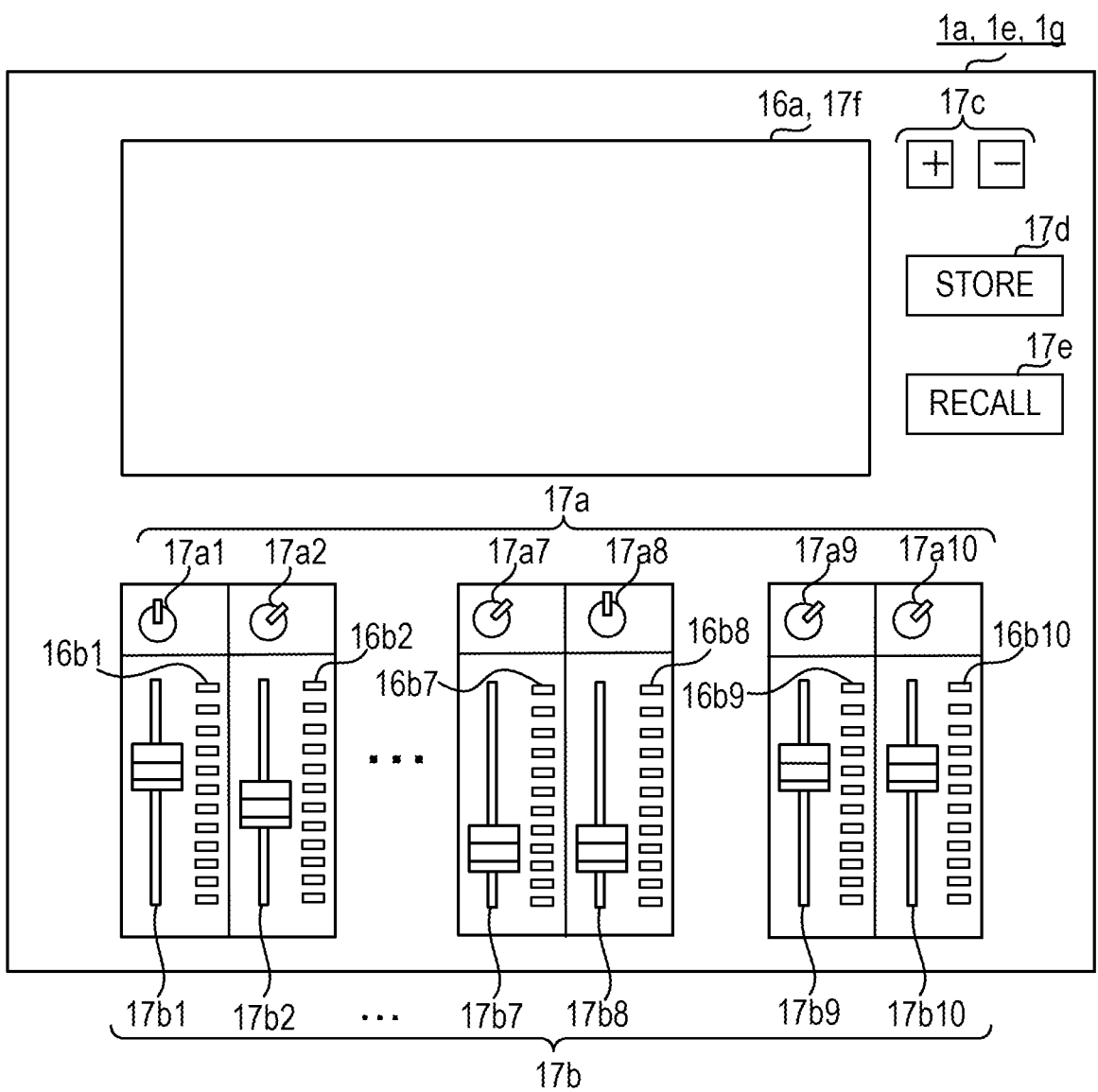

Hereinafter, a mixing apparatus 1a that executes an audio signal processing method according to a first embodiment will be described with reference to the drawings. FIG. 1 is a block diagram showing a configuration of the mixing apparatus 1a. FIG. 2 is a view showing an appearance of the mixing apparatus 1a.

The mixing apparatus 1a is an example of an audio signal processing apparatus. The mixing apparatus 1a executes signal processing such as level adjustment of an audio signal, mixing of audio signals, or the like. The mixing apparatus 1a, as shown in FIG. 1, includes an audio interface 11, a network interface 12, a flash memory 13, a RAM (Random Access Memory) 14, a CPU (Central Processing Unit) 15, a display 16, a user interface 17, a DSP (Digital Signal Processor) 18, and a bus 19. The audio interface 11, the network interface 12, the flash memory 13, the RAM 14, the CPU 15, the display 16, the user interface 17, and the DSP 18 are connected to each other through the bus 19.

The audio interface 11, for example, receives an audio signal from an audio device such as a microphone or an electronic musical instrument, through an audio cable. The audio interface 11, for example, sends the audio signal on which the signal processing has been performed, through the audio cable, to the audio device such as a speaker.

The network interfaces 12 communicates with other apparatus (such as a PC, for example) different from the mixing apparatus 1a, through a communication line. The communication line, for example, is the Internet or a LAN (Local Area Network). The network interface 12 communicates with the other apparatus such as a PC, by wireless or wired. It is to be noted that the network interface 12 may send and receive an audio signal via a network according to a standard such as Dante (registered trademark).

The flash memory 13 stores various programs. The various programs, for example, include a program to operate the mixing apparatus 1a, or a program to execute sound processing according to the audio signal processing method of the present disclosure. It is to be noted that the flash memory 13 does not necessarily need to store the various programs. The various programs, for example, may be stored in other apparatus such as a server. In such a case, the mixing apparatus 1a receives the various programs from the other apparatus such as a server.

The RAM 14 reads and temporarily stores a program stored in the flash memory 13.

The CPU 15 (an example of the processor) executes various types of processing by reading the program stored in the flash memory 13, to the RAM 14. The various types of processing, for example, include processing to convert an analog audio signal into a digital audio signal, and the sound processing according to the audio signal processing method of the present disclosure. The CPU 15 converts an analog audio signal into a digital audio signal, based on a sampling frequency and a quantization bit rate that are set up in advance. The sampling frequency may be 48 kHz, for example, and the quantization bit rate may be 24 bits, for example.

The DSP 18 performs signal processing on the audio signal received through the audio interface 11 or the network interface 12. The signal processing includes acoustic processing such as mixing processing or effect processing. The DSP 18 performs the signal processing, based on current data stored in the RAM 14. The current data includes current various parameter values of the audio signal processing (gain adjustment, effect processing, mixing processing, or the like) to be executed by the DSP 18. The various parameter values are changed by an operation by a user, through the user interface 17. The CPU 15, when receiving an operation from a user through the user interface 17, updates the current data. The audio signal on which the signal processing has been performed is sent to the audio interface 11 through the bus 19. It is to be noted that the DSP 18 may be constituted by a plurality of DSPs.

The display 16 displays various types of information based on the control of the CPU 15. For example, the display 16 displays a level of the audio signal. The display 16 includes a screen 16a and a meter 16b. A plurality of meters 16b are provided for respective channel strips. In the example shown in FIG. 2, the meter 16b includes eight meters 16b1 to 16b8 corresponding to eight input channel strips, and two meters 16b9 and 16b10 corresponding to two output channel strips. It is to be noted that the number of channel strips and the number of meters 16b are not limited to 10.

The screen 16a, for example, is a liquid crystal display, or the like. The screen 16a displays an image based on the control of the CPU 15.

The meter 16b is made of a plurality of LEDs to display the level of the audio signal. The CPU 15 turns on or off the plurality of LEDs of the meter 16b based on the level of the audio signal. For example, in the example shown in FIG. 2, each of the meters 16b1 to 16b10 is configured by 12 LEDs arranged in a vertical direction in the plane of the drawing. A corresponding level value is assigned to each of the 12 LEDs. For example, in FIG. 2, the CPU 15 turns off all the 12 LEDs, when the level of the audio signal is silence, that is, $-\infty$ dB. The CPU 15 turns on all the 12 LEDs, when the level of the audio signal is the maximum, that is, 0 dB. In addition, for example, the CPU 15 turns on four LEDs from the bottom, when the level of the audio signal is $-12$ dB. As a result, the user can visually know the level of the audio signal inputted into each input channel. It is to be noted that the meter 16b is not limited to an LED and may be an image displayed on the screen 16a.

The user interface 17 is an example of a plurality of physical controllers that receive an operation to the mixing apparatus 1a from a user (hereinafter simply referred to as a user) of the mixing apparatus 1a. The user interface 17, for example, as shown in FIG. 2, includes a knob 17a, a fader 17b, an increase and decrease button 17c, a store button 17d, a recall button 17e, and a touch panel 17f The knob 17a and the fader 17b are provided for each channel strip.

The touch panel 17f is stacked on the screen 16a. The touch panel 17f receives a touch operation or the like to the touch panel 17f from the user.

The knob 17a receives adjustment of a gain of the audio signal inputted into a plurality of channels. In the example shown in FIG. 2, the knob 17a includes eight knobs 17a1 to 17a8 corresponding to eight input channel strips, and two knobs 17a9 and 17a10 corresponding to two output channel strips. It is to be noted that the number of knobs 17a is not limited to 10.

The fader 17b receives a level adjustment amount of the audio signal inputted into the plurality of channels. The user, by sliding the fader 17b, adjusts a send level of the audio signal from each input channel to the output channel. In the example shown in FIG. 2, the fader 17b includes eight faders 17b1 to 17b8 corresponding to eight input channel strips, and two faders 17b9 and 17b10 corresponding to two output channel strips. It is to be noted that the number of faders 17b is not limited to 10.

The store button 17d is a button that instructs storage (store) of data (scene data) of a scene memory. The user can cause the flash memory 13 to store the current data as one scene data by operating (pressing) the store button 17d.

The increase and decrease button 17c is a button that receives an operation to select a scene memory to be stored and recalled, among a plurality of scene memories.

The recall button 17e is a button that receives instructions (scene recall) to call the scene data stored in the flash memory 13, to the RAM 14, as the current data. The user, by operating (pressing) the recall button 17e to call data of a required scene memory, can call a setting value of various parameters.

It is to be noted that the functions of the increase and decrease button 17c, the store button 17d, and the recall button 17e may be configured by a GUI (Graphical User Interface) using the touch panel 17f.

Figure 3:
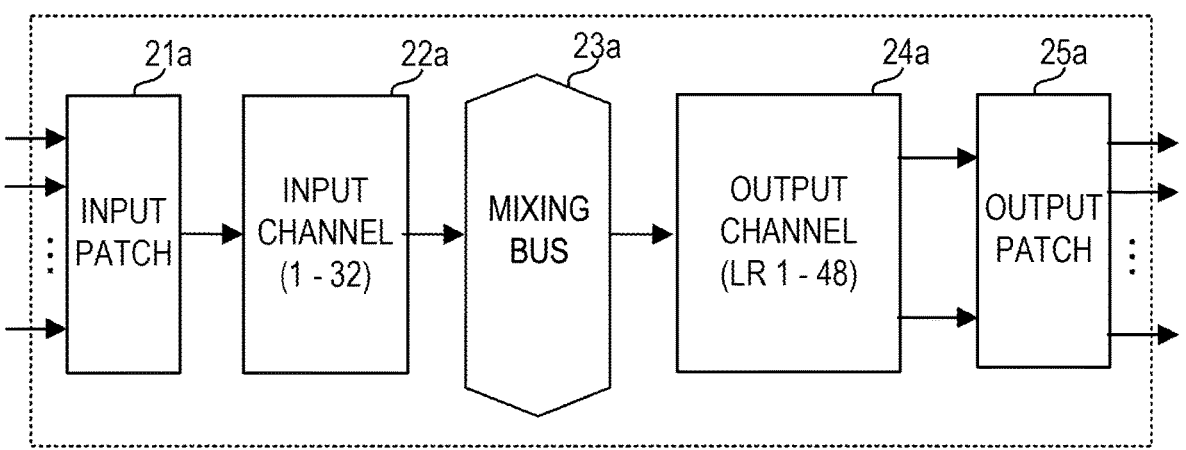
Figure 4:
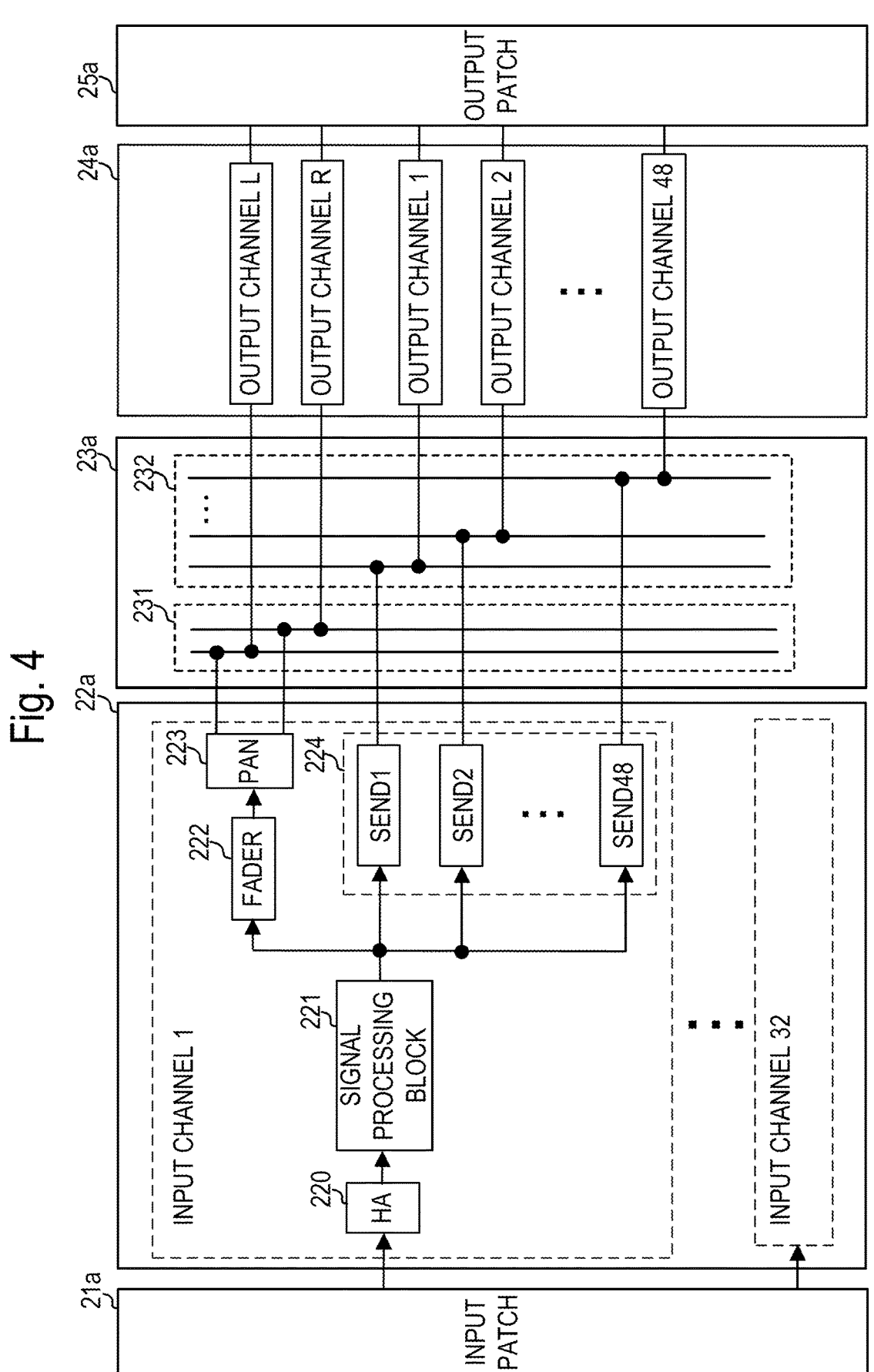

Hereinafter, signal processing to be executed by the mixing apparatus 1a will be described with reference to the drawings. FIG. 3 is a block diagram of the signal processing to be executed by the mixing apparatus 1a. FIG. 4 is a block diagram showing a processing configuration of an input patch 21a, an input channel 22a, a mixing bus 23a, an output channel 24a, and an output patch 25a. It is to be noted that, in FIG. 4, only the signal processing in the input channel 1 is described, and the description of the signal processing in the input channels 2 to 32 is omitted.

As shown in FIG. 3, the signal processing in the mixing apparatus 1a is functionally performed by the input patch 21a, the input channel 22a, the mixing bus 23a, the output channel 24a, and the output patch 25a.

The input patch 21*a* receives an audio signal from a plurality of input ports (analog ports or digital ports, for example) in the audio interface 11. The input patch 21*a* assigns one port among the plurality of input ports to at least one input channel in a plurality of input channels (a total of 32 channels of the input channels 1 to 32, for example) included in the input channel 22*a*. Accordingly, the input patch 21*a* sends the audio signal to each input channel of the input channel 22*a*.

A corresponding physical controller is optionally assigned to each input channel. The mixing apparatus 1*a*, in a case of including eight knobs 17*a* and eight faders 17*b*, for example, is able to assign the eight knobs 17*a* and the eight faders 17*b*, respectively, to the input channels 1 to 8. For example, the knob 17*a*1 and the fader 17*b*1 in FIG. 2 are assigned to the input channel 1. In such a case, the user, by operating the knob 17*a*1, can adjust the gain of the audio signal inputted into the input channel 1. Similarly, the user, by operating the fader 17*b*1, can adjust the send level of the audio signal outputted from the input channel 1.

Hereinafter, the signal processing in the input channel 1 will be described as an example. The input channel 1, as shown in FIG. 4, functionally includes a head amplifier (HA) 220, a signal processing block 221, a fader (FADER) 222, a pan (PAN) 223, and a sender (SEND) 224.

The head amplifier 220 performs gain adjustment of an audio signal inputted into the input channel 1. The head amplifier 220 sends the audio signal on which the gain adjustment has been performed, to the signal processing block 221.

The signal processing block 221 performs signal processing such as an equalizer or a compressor on the audio signal on which the gain adjustment has been performed by the head amplifier 220.

The fader 222 adjusts a level of the audio signal on which the signal processing has been performed by the signal processing block 221, based on the send level set up by the fader 17*b* being a physical controller.

The mixing bus 23*a* includes a stereo bus 231 and a MIX bus 232. The stereo bus 231 is a bus of two channels used as a master output. The pan 223 adjusts a balance of the audio signal supplied to each of the two channels of the stereo bus 231. As shown in FIG. 4, the pan 223 outputs the audio signal of which the balance has been adjusted, to the stereo bus 231. The stereo bus 231 is connected to the output channel 24*a*. The stereo bus 231 sends the audio signal received from the pan 223, to the output channel 24*a*.

The MIX bus 232 includes a plurality of channels (48 channels as shown in FIG. 3 or FIG. 4, for example). The sender 224 switches whether or not to supply an audio signal to each channel of the MIX bus 232, based on an operation by a user. In addition, the sender 224 adjusts the level of the audio signal to be supplied to each channel of the MIX bus 232, based on the send level set by the user. As shown in FIG. 4, the sender 224 outputs the audio signal of which the level has been adjusted, to the MIX bus 232. The MIX bus 232 is connected to the output channel 24*a*. The MIX bus 232 sends the audio signal inputted from the sender 224, to the output channel 24*a*.

The output channel 24*a* includes a plurality of channels. Each channel of the output channel 24*a* performs various kinds of signal processing on the audio signal received from the mixing bus 23*a*. Each channel of the output channel 24*a* sends the audio signal on which the signal processing has been performed, to the output patch 25*a*.

The output patch 25*a* assigns one port in a plurality of output ports (analog output ports or digital output ports) to at least one channel in the plurality of channels included in the output channel 24*a*. Accordingly, the audio signal on which the signal processing has been performed is sent to the audio interface 11.

The processing to be performed by the input patch 21*a*, the input channel 22*a*, the mixing bus 23*a*, the output channel 24*a*, and the output patch 25*a* that are shown above is performed based on a value of various parameters.

In the above processing, the CPU 15 turns on a light of the meter 16*b*1 corresponding to the input channel 1 based on the level (dB) of the audio signal on which the gain adjustment has been performed in the head amplifier 220. The CPU 15 generates meter data to control the meter 16*b*1 based on a plurality of samples of the audio signal for a preset predetermined time (1/60 seconds, or the like, for example). The meter data is an example of time-series sound volume data. The CPU 15 controls the meter 16*b*1 based on the meter data, and displays the level of the audio signal.

As an example, while the sampling frequency of the audio signal is 48 kH, the sampling frequency of the meter data is 60 Hz lower than the sampling frequency of the audio signal. For example, the CPU 15 obtains 800 samples of the audio signal corresponding to 1/60 seconds. The CPU 15, for example, reduces the sampling frequency by averaging the 800 samples of the audio signal, and generates meter data of one sample.

As an example, while the quantization bit rate of the audio signal is 24 bits, the quantization bit rate of the meter data is 4 bits that is required in order to turn on or turn off 12 LEDs and is smaller than the quantization bit rate of the audio signal. The CPU 15, for example, reduces and rounds the quantization bit rate of the audio signal quantized with 24 bits (approximately 16.77 million gradations) to 4-bit meter data of 12 gradations.

Figure 5:
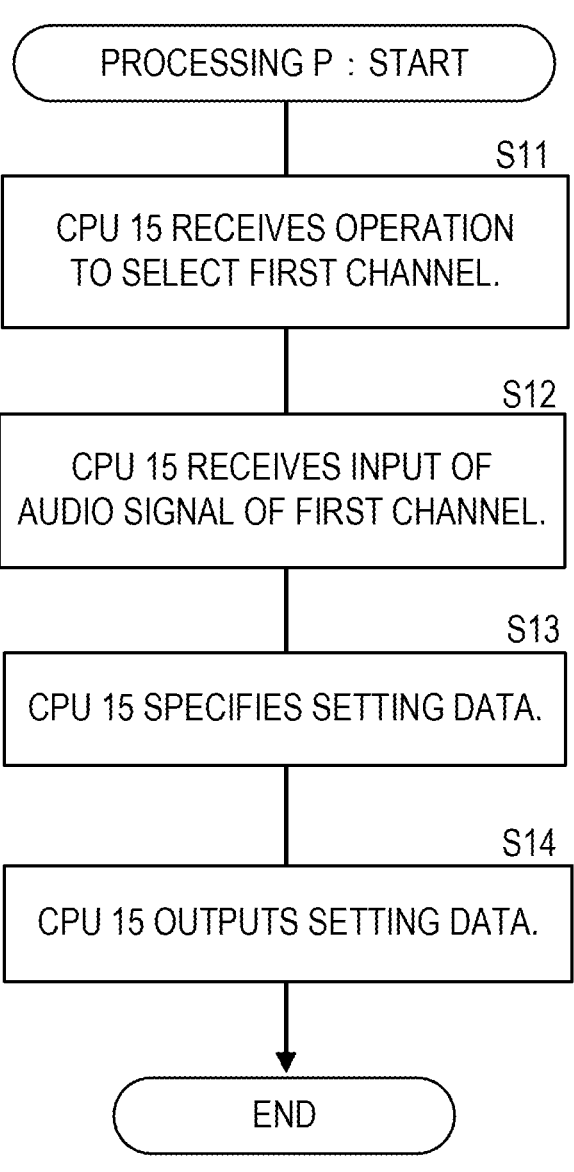

Hereinafter, the audio signal processing (hereinafter referred to as processing P) will be described with reference to the drawings. FIG. 5 is a flow chart showing an example of the processing of the mixing apparatus 1*a*.

The mixing apparatus 1*a*, for example, starts an operation of FIG. 5 when a program according to the processing P is executed (FIG. 5: START).

After the start of the processing P, the CPU 15 receives an operation to select one channel (a first channel) in the plurality of input channels (FIG. 5: Step S11). For example, the CPU 15 displays a button (hereinafter referred to as a selection button) corresponding to at least one of the input channels 1 to 32 in the input channel 22*a*, on the screen 16*a*. A user, for example, touches the selection button corresponding to the input channel 1, and selects the input channel 1. Hereinafter, a case in which the input channel 1 is selected will be described.

Next, the CPU 15 receives an input of an audio signal of a selected input channel 1 (the first channel) (FIG. 5: Step S12).

Next, the CPU 15 specifies setting data to be set to the mixing apparatus 1*a* (FIG. 5: Step S13). In the present embodiment, the setting data includes a value of a gain in the head amplifier 220. The CPU 15 specifies the value (an example of the setting data) of the gain to be set to the head amplifier 220, based on the time-series sound volume data. For example, the CPU 15 specifies (specifies the gain of the head amplifier 220 so that the level of a peak of an inputted audio signal may not exceed −6 dB, for example) the gain of the head amplifier 220 such that clipping or the like does not occur in a sound to be inputted into the selected input channel.

In the present embodiment, the CPU 15, for example, specifies the setting data by processing with artificial intelligence of neural network (such as DNN (Deep Neural Network)). A skilled mixer engineer looks at the meter 16*b*1 and sets the gain of the head amplifier 220 so that the level of the peak of the inputted audio signal may not exceed −6 dB. In short, the skilled mixer engineer sets the gain of the head amplifier 220, based on the meter data. Accordingly, correlation is between the time-series sound volume data and the gain of the head amplifier 220. Therefore, the CPU 15 is able to cause a predetermined model to learn a relationship between the time-series sound volume data and the gain of the head amplifier 220. The CPU 15 specifies the setting data by using a first learned model that has already learned the relationship between the time-series sound volume data (the meter data) and the setting data (the gain of the head amplifier 220).

The skilled mixer engineer, for example, adjusts the gain of the head amplifier 220 by looking at about three samples (1/60 sec×3 samples≈about 50 msec) of the meter data. After the predetermined model learns the relationship between the time-series sound volume data and the gain of the head amplifier 220, the CPU 15 in an execution phase of the artificial intelligence, for example, is able to specify the setting data by using three samples of the meter data (by obtaining the time-series sound volume data for 1/60 sec×3 samples≈50 msec).

It is to be noted that, in the execution phase of the artificial intelligence, the CPU when setting the gain of the head amplifier 220, may use the number of samples according to an index of sound volume that the skilled mixer engineer uses. The skilled mixer engineer, for example, adjusts the gain of the head amplifier 220 by using a VU meter or a loudness meter as an index. The VU meter indicates an average sound volume in a period of 300 msec. The CPU 15, for example, may obtain a plurality of samples of the meter data in the period of 300 msec, and specify the setting data by using the obtained plurality of samples of the meter data. The loudness meter indicates a value (momentary loudness) of loudness in a period of 400 msec or a value (short-term loudness) of loudness in a period of 3 sec. The CPU 15, for example, may obtain the plurality of samples of the meter data for 400 msec or 3 sec, and specify the setting data by using the obtained plurality of samples of the meter data. It is to be noted that, since the VU meter and the loudness meter are examples of the index of sound volume, a meter other than the VU meter and the loudness meter may be an index of sound volume.

As shown above, a skilled engineer refers to the meter such as the VU meter or the loudness meter, and adjusts the gain of the head amplifier 220 between about 50 msec and about 3 sec to achieve appropriate sound volume. The CPU 15 replicates adjustment of such a skilled mixer engineer, and adjusts the gain of the head amplifier 220 between about 50 msec and about 3 sec to achieve appropriate sound volume. As a result, the CPU 15 is able to automatically perform the gain adjustment of the head amplifier 220, in a similar method that the skilled mixer engineer manually performs the gain adjustment.

The CPU 15 outputs the specified setting data (the gain of the head amplifier 220) to the RAM 14 (FIG. 5: Step S14). The CPU 15 updates the value of the gain of the head amplifier 220 among the current data of the RAM 14, with a value of the specified gain. Accordingly, the DSP 18 performs signal processing on an audio signal, based on the updated current data.

The above processing from Step S11 to Step S14 completes execution of the processing P (FIG. 5: END).

Advantageous Effects

The skilled mixer engineer performs the gain adjustment of the head amplifier 220, based on the display of the meter 16*b* so that clipping may not occur. The mixing apparatus 1*a* replicates such an adjustment method of the skilled mixer engineer by artificial intelligence, for example. The mixing apparatus 1*a* is able to automatically adjust the gain of the head amplifier 220, in the similar method that the skilled mixer engineer manually performs the gain adjustment.

The time-series sound volume data, although being capable of using the plurality of samples of the audio signal, is preferably the meter data as described above. The sampling frequency of the meter data is more significantly lower than the sampling frequency of the audio signal. In addition, the quantization bit rate of the meter data is more significantly lower than the quantization bit rate of the audio signal. As a result, the mixing apparatus 1*a*, by performing a learning phase and the execution phase with the meter data, is able to specify the gain of the head amplifier 220 with significantly lower calculation amount than performing the learning phase and the execution phase of a predetermined model using an audio signal.

Modification 1 of First Embodiment

Figure 6:
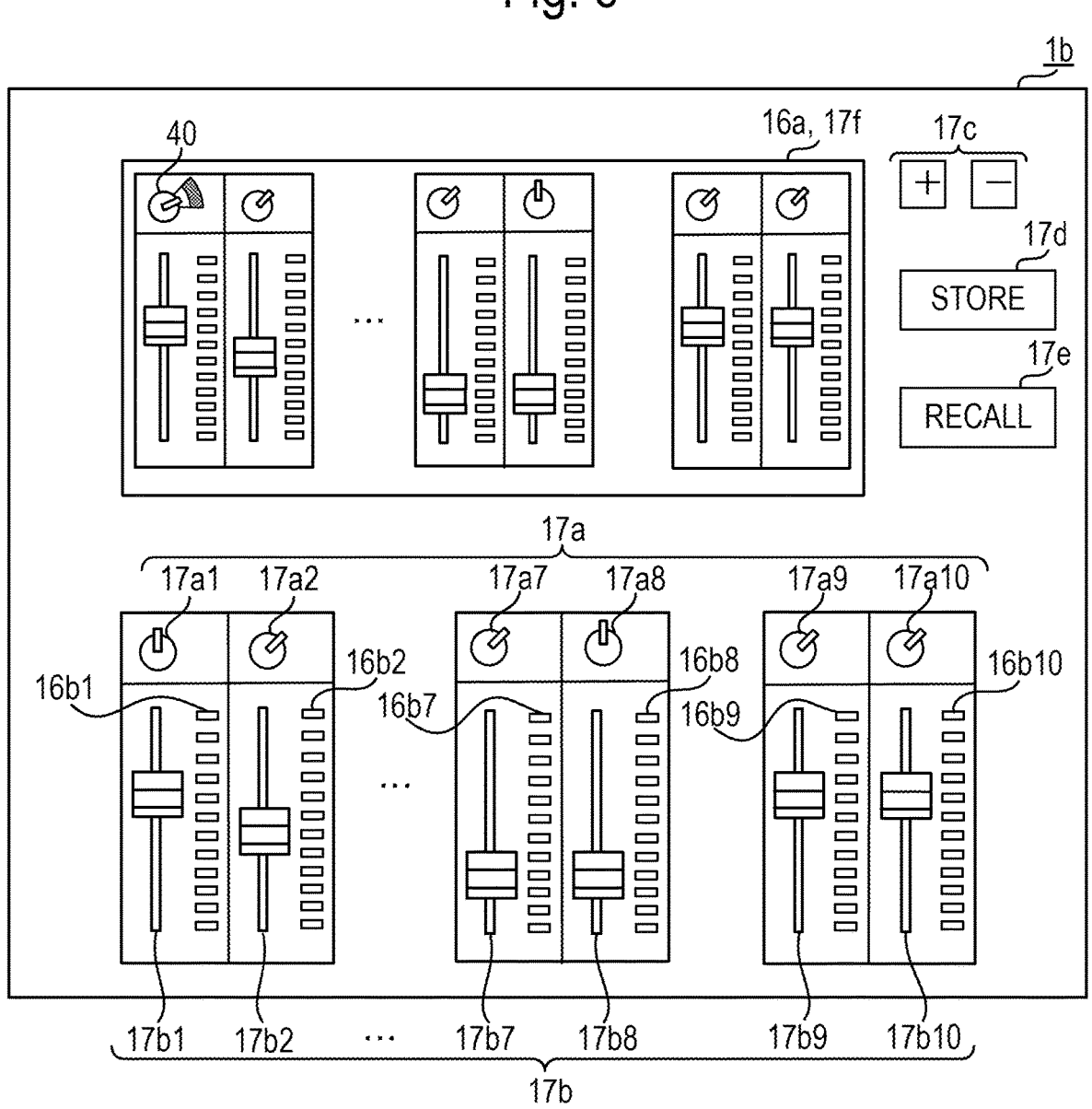
FIG. 6 is a view showing an appearance of a mixing apparatus 1b according to a modification 1 of a first embodiment.

Hereinafter, a mixing apparatus 1*b* according to a modification 1 of the first embodiment will be described with reference to the drawings. FIG. 6 is a view showing an appearance of the mixing apparatus 1*b* according to the modification 1 of the first embodiment.

The screen 16*a* of the mixing apparatus 1*b* displays a specified gain of the head amplifier 220. For example, the CPU 15 of the mixing apparatus 1*b*, as shown in FIG. 6, displays an image imitating the knob 17*a* on the screen 16*a*. For example, the CPU 15 displays an image (an image imitating the knob 17*a*1) of a knob 40 that indicates a specified gain, and an image that indicates a range of a specified gain ±α (α is any value), on the screen 16*a*. A user refers to the knob 40 displayed on the screen 16*a*, and adjusts the knob 17*a*1. The user can optionally determine whether or not to set the gain of the head amplifier 220 as the gain of the head amplifier 220 specified by the learned model.

It is to be noted that the CPU 15 may display an image that indicates only the specified gain of the head amplifier 220, without displaying the range of the specified gain ±α. For example, a text message (a text message such as "please set the knob 17*a*1 to −3 dB," for example) that indicates the value of the specified gain may be displayed.

Modification 2 of First Embodiment

Figure 7:
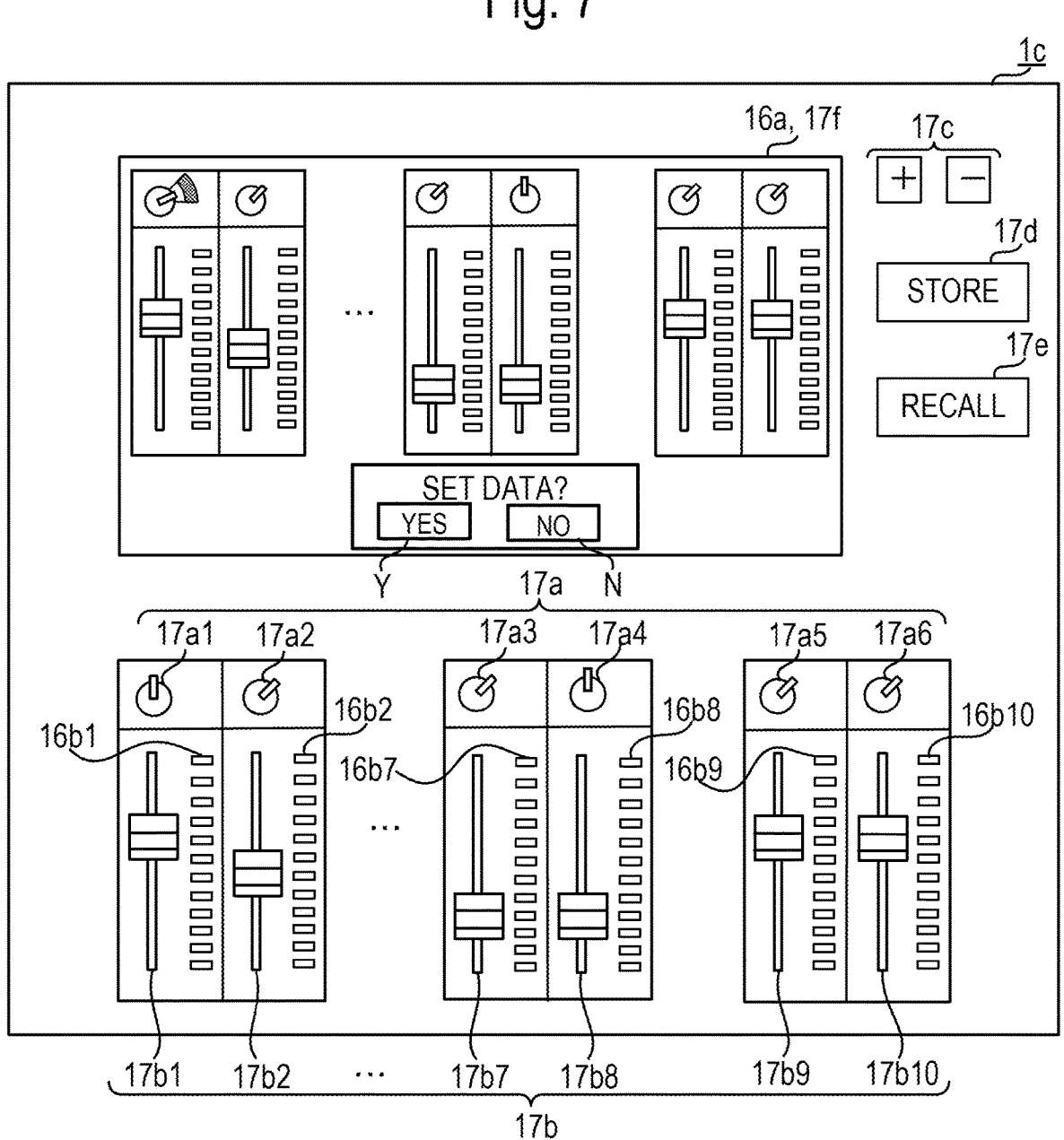
FIG. 7 is a view showing an appearance of a mixing apparatus 1c according to a modification 2 of the first embodiment.

Hereinafter, a mixing apparatus 1*c* according to a modification 2 of the first embodiment will be described with reference to the drawings. FIG. 7 is a view showing an appearance of the mixing apparatus 1*c* according to the modification 2 of the first embodiment.

The CPU 15 of the mixing apparatus 1*c*, after displaying the specified gain of the head amplifier 220, receives an operation as to whether or not to set the gain as current data. For example, as shown in FIG. 7, the CPU 15 displays a button Y that receives an operation to set the specified gain of the head amplifier 220 as the current data, on the screen 16a. A user, in a case of setting the gain of the head amplifier 220 displayed on the screen 16a as current data, performs a touch operation of the button Y. In such a case, the CPU 15 updates the current data with the specified gain of the head amplifier 220. On the other hand, the CPU 15, in a case of detecting an operation of a button N displayed on the screen 16a, does not update the current data with the specified gain of the head amplifier 220. In this manner, the user, after checking the content of the specified gain of the head amplifier 220, can determine whether or not to set the gain.

Modification 3 of First Embodiment

Figure 8:
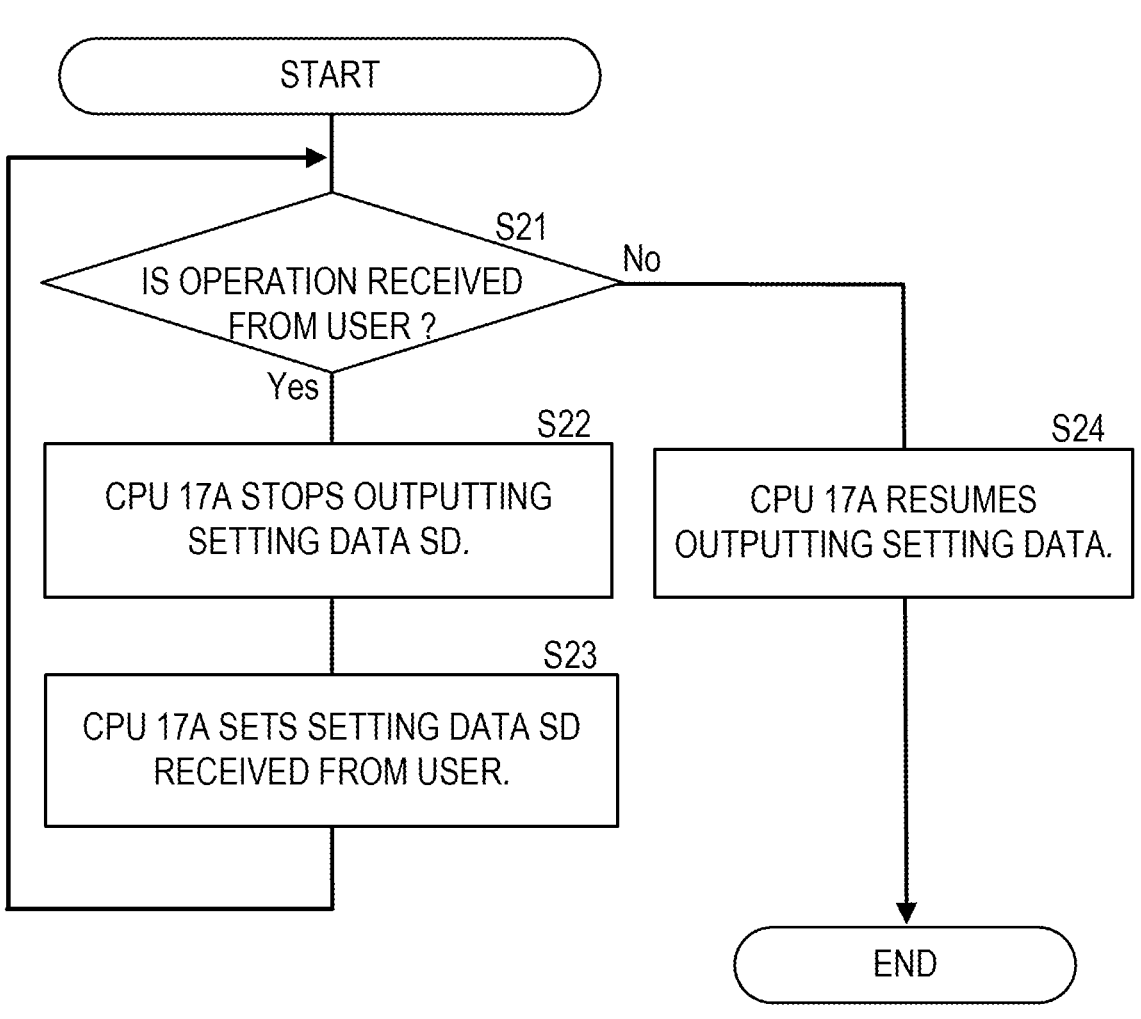
FIG. 8 is a flow chart showing an example of processing of a mixing apparatus 1d according to a modification 3 of the first embodiment.

Hereinafter, a mixing apparatus 1d according to a modification 3 of the first embodiment will be described with reference to the drawings. FIG. 8 is a flow chart showing an example of processing of the mixing apparatus 1d according to the modification 3 of the first embodiment.

The CPU 15 of the mixing apparatus 1d determines whether or not to receive an operation (an operation according to adjustment of the gain of the head amplifier 220, for example) from a user (FIG. 8: Step S21). The CPU 15, in a case of receiving an operation from the user (FIG. 8: Yes in step S21), stops output of specified setting data (a gain of the head amplifier 220, for example) to the RAM 14 (FIG. 8: Step S22). Then, the CPU 15 sets the setting data based on the operation received from the user, to the mixing apparatus 1d (FIG. 8: Step S23). As a result, the hand regulation of various kinds of parameters by a user is not inhibited by automatic adjustment by the mixing apparatus 1d.

On the other hand, in Step S21, the CPU 15, in a case of receiving no operation from the user (FIG. 8: No in step S21), resumes the output of the specified setting data (FIG. 8: Step S24). Accordingly, the mixing apparatus 1d, in the case of receiving no operation from the user, automatically adjusts the gain of the head amplifier 220. The mixing apparatus 1d is able to appropriately switch whether or not to perform adjustment of the gain of the head amplifier 220, according to the presence or absence of an operation by the user.

Second Embodiment

Hereinafter, a mixing apparatus 1e according to a second embodiment will be described while FIG. 2 is applied accordingly. In a description, a case in which the input channel 1 is selected by a user will be described as an example in a similar way as in the first embodiment.

The CPU 15 of the mixing apparatus 1e, for example, specifies setting data (a fader value of the first channel), based on a fader value (data on the second channel) of the input channels 2 to 32 (the second channel) that are different from the input channel 1 (the first channel). In the present embodiment, the setting data includes a level adjustment amount received by the fader 17b. For example, the CPU 15 adjusts the fader value of the input channel 1, based on the fader value of the input channels 2 to 8 so that sound volume balance in mixing of the input channels 1 to 8 may become appropriate.

In the present embodiment, the CPU 15 specifies the setting data by using a second learned model that has already learned a relationship between the data (the value of the fader) on the input channels 2 to 32 (the second channel), and the setting data (a fader value of the first channel). A skilled mixer engineer looks at a value of the faders 17b2 to 17b8 of the input channels 2 to 32, and adjusts a value of the fader 17b1 of the input channel 1 while considering the sound volume balance. Accordingly, correlation is between the data (the value of the faders 17b2 to 17b8) on the input channels 2 to 32 and the value of the fader 17b1. Therefore, the CPU 15 is able to cause a predetermined model to learn the relationship between the data on the input channels 2 to 32 and the value of the fader 17b1.

Advantageous Effects

For example, the skilled mixer engineer, in a case of setting the value of the fader 17b1, refers to the value of the other faders 17b2 to 17b8, and adjusts the value while considering the sound volume balance. The mixing apparatus 1e replicates sound volume balance adjustment (time-consuming adjustment by the skilled mixer engineer, such as when creating a sound source for a CD, for example) similar to the adjustment of the sound volume balance between the channels that is performed by the skilled mixer engineer. As a result, the mixing apparatus 1e is able to automatically perform the sound volume balance adjustment between the channels, in a similar method that the skilled mixer engineer manually adjusts the sound volume balance between the channels.

Modification 1 of Second Embodiment

Hereinafter, a mixing apparatus if according to a modification 1 of the second embodiment will be described with reference to the drawings. FIG. 9 is a view showing an image displayed on a screen 16a of the mixing apparatus if according to the modification 1 of the second embodiment.

In the present modification, the data on the input channels 2 to 32 that are different from the input channel 1 is data (text data or the like) on a type (a musical instrument name) of a sound source. For example, the skilled mixer engineer may perform balance adjustment between the channels, according to the type of a musical instrument corresponding to each of the input channels 1 to 32. The CPU 15 replicates such adjustment of the skilled mixer engineer. As an example, the CPU 15 adjusts the fader value of the input channel 1 so that the sound volume according to the input channel 1 (sound source: vocal) may be larger than the sound volume according to the input channel 2 (sound source: guitar). In this manner, the mixing apparatus 1e is able to replicate the balance adjustment between the channels by the skilled mixer engineer.

Modification 2 of Second Embodiment

Hereinafter, a mixing apparatus 1g according to a modification 2 of the second embodiment will be described while FIG. 2 is applied accordingly. The CPU 15 of the mixing apparatus 1g, when executing scene recall, updates current data by read scene data. Therefore, the CPU 15 preferably redoes sound volume balance adjustment between the channels by the learned model. Accordingly, the CPU 15, in a case of receiving the scene recall (in a case in which the recall button 17e shown in FIG. 2 is pressed by a user), specifies the level adjustment amount (setting data) of the input channel 1 based on the read scene data. The scene data includes useful information for performing the sound volume balance adjustment between the channels, such as information on a musical instrument. Accordingly, the mixing apparatus 1e, by using the read scene data, is able to further more correctly replicate the sound volume balance adjustment between the channels that is performed by the skilled mixer engineer.

Modification 3 of Second Embodiment

Hereinafter, a mixing apparatus 1h according to a modification 3 of the second embodiment will be described while FIG. 9 is applied accordingly. The mixing apparatus 1h, in specifying the setting data, uses data related to input channels to which the physical controllers (the knob 17a, the fader 17b) are not assigned.

In the example shown in FIG. 9, the CPU 15 of the mixing apparatus 1h assigns the input channels 1 to 8 (a first channel group) to the physical controllers. On the other hand, the mixing apparatus 1h does not assign the input channels 9 to 32 (a second channel group) to the physical controllers. Even in this case, the mixing apparatus 1h, for example, adjusts the fader value of the input channel 1, based on each fader value of the input channels 2 to 32. As a result, the mixing apparatus 1h, even without checking fader values of not-displayed channels (the input channels 9 to 32) is able to adjust the sound volume balance between the channels while taking not-displayed fader values into account.

In a case in which the number of channels of the mixing apparatus is huge, the number of input channels that are not assigned to the physical controllers is huge. In such a case, the user has difficulty considering fader values of all the input channels. However, the mixing apparatus 1h automatically sets a fader value of a selected input channel 1, based on the fader values of all the input channels.

The mixing apparatus 1e may have a mode (a split mode) in which the input channels 1 to 32 are divided into the first input channels 1 to 16 (the first channel group) being a first signal processing system, and the second input channels 1 to 16 being a second signal processing system. In such a case, the CPU 15 of the mixing apparatus 1h, for example, while assigning the first input channels 1 to 8 (the first channel group) among the first input channels 1 to 16 of the first signal processing system to the physical controllers, does not assign the first input channels 9 to 16 of the first signal processing system and the second input channels 1 to 16 (the second channel group) of the second signal processing system to the physical controllers. At this time, the user, for example, selects the input channel 1 of the first signal processing system. The mixing apparatus 1h specifies the fader value of the first input channel 1 of the first signal processing system, based on each fader value of the first input channels 2 to 16 being the first signal processing system and each fader value of the second input channels 1 to 16 being the second signal processing system. However, the audio signal to be inputted into the first input channel 1 of the first signal processing system is the same as the signal to be inputted into the second input channel 1 of the second signal processing system. Accordingly, the mixing apparatus 1h, in specifying the fader value of the input channel 1, does not necessarily need to use the fader value of the second input channel 1 of the second signal processing system.

The descriptions of the embodiments of the present disclosure are illustrative in all points and should not be construed to limit the present disclosure. The scope of the present disclosure is defined not by the foregoing embodiments but by the following claims for patent. Further, the scope of the present disclosure is intended to include all modifications within the scopes of the claims for patent and within the meanings and scopes of equivalents.

It is to be noted that the configurations of the mixing apparatus 1a to 1h may be optionally combined.

What is claimed is:

1. An audio signal processing method for a mixing apparatus including:

a plurality of channels;
a head amplifier that performs gain adjustment of an audio signal to be input into the plurality of channels; and
a fader that receives a level adjustment amount of the audio signal input into the plurality of channels,
the audio signal processing method comprising:
    selecting at least a first channel among the plurality of channels;
    inputting an audio signal of the selected first channel;
    specifying setting data to be set to the mixing apparatus, based on time-series sound volume data for the first channel or data on a second channel different from the first channel, among the plurality of channels, wherein the setting data includes a gain of the head amplifier and the level adjustment amount received by the fader, and the specifying includes:
        specifying the gain of the head amplifier based on the time-series sound volume data; and
        specifying the level adjustment amount based on the data from the second channel; and
    outputting the specified setting data.

2. The audio signal processing method according to claim 1, wherein the time-series sound volume data is obtained by decreasing a sampling frequency of the input audio signal or by reducing a quantization bit rate of the input audio signal.

3. The audio signal processing method according to claim 1, wherein the mixing apparatus includes a display that displays a level of the input audio signal, based on the time-series sound volume data.

4. The audio signal processing method according to claim 1, further comprising:

storing in a memory a parameter of signal processing to be performed on each audio signal of the plurality of channels, as scene data; and
receiving scene recall that reads the scene data stored in the memory,
wherein the specifying specifies the setting data upon receiving the scene recall based on read scene data.

5. The audio signal processing method according to claim 1, further comprising identifying a type of a sound source of the input audio signal,
wherein the specifying specifies the setting data according to the identified type of the sound source.

6. The audio signal processing method according to claim 1, wherein:

the mixing apparatus includes a plurality of physical controllers configured to receive an operation from a user;
the plurality of channels include a first channel group and a second channel group;
the first channel group is assigned to the plurality of physical controllers; and
the second channel includes channels, among the plurality of channels, in the second channel group that are not assigned to the plurality of physical controllers.

7. The audio signal processing method according to claim 1, further comprising, upon receiving a user adjustment of the setting data:

stopping the outputting of the setting data, and
setting the setting data received from the user to the mixing apparatus.

8. The audio signal processing method according to claim 7, wherein, in a state where no adjustment of the setting data is determined to be received from the user, the outputting of the setting data is resumed.

9. The audio signal processing method according to claim 1, further comprising displaying content of the setting data on a display, based on the output setting data.

10. The audio signal processing method according to claim 9, further comprising:

receiving an operation as to whether or not to set the setting data, after the displaying the content of the setting data; and setting the setting data to the mixing apparatus, upon receiving the operation to set the setting data.

11. The audio signal processing method according to claim 1, wherein the setting data is specified using:

a first learned model that has already learned a relationship between the time-series sound volume data for the first channel and the setting data; or a second learned model that has already learned a relationship between the data on the second channel and the setting data.

12. An audio signal processing apparatus comprising:

a plurality of channels;

a head amplifier that performs gain adjustment of an audio signal to be input into the plurality of channels;

a fader that receives a level adjustment amount of the audio signal input into the plurality of channels; and a processor configured to:

receive an operation to select at least a first channel among the plurality of channels;

input an audio signal of the selected first channel;

specify setting data to be set to an own apparatus, based on time-series sound volume data for the first channel or data on a second channel different from the first channel, among the plurality of channels, wherein the setting data includes a gain of the head amplifier and the level adjustment amount received by the fader, and the specify includes:

specify the gain of the head amplifier based on the time-series sound volume data; and specify the level adjustment amount based on the data from the second channel; and output the specified setting data.

13. The audio signal processing apparatus according to claim 12, wherein the processor obtains the time-series sound volume data by decreasing a sampling frequency of the input audio signal or by reducing a quantization bit rate of the input audio signal.

14. The audio signal processing apparatus according to claim 12, further comprising a display that displays a level of the input audio signal, based on the time-series sound volume data.

15. The audio signal processing apparatus according to claim 12, further comprising:

a memory that stores a parameter of signal processing to be performed on each audio signal of the plurality of channels, as scene data, wherein the processor is configured to receive scene recall that reads the scene data stored in the memory, and wherein the processor specifies the setting data upon receiving the scene recall based on read scene data.

16. The audio signal processing apparatus according to claim 12, wherein the processor:

is configured to identify a type of a sound source of the input audio signal, and specifies the setting data according to the type of the identified sound source.

17. The audio signal processing apparatus according to claim 12, further comprising:

a plurality of physical controllers configured to receive an operation from a user, wherein the plurality of channels include a first channel group and a second channel group;

wherein the processor is configured to assign the first channel group to the plurality of physical controllers, and wherein the second channel includes channels, among the plurality of channels, in the second channel group that are not assigned to the plurality of physical controllers.

18. The audio signal processing apparatus according to claim 12, wherein the processor specifies the setting data by using:

a first learned model that has already learned a relationship between the time-series sound volume data for the first channel and the setting data; or a second learned model that has already learned a relationship between the data on the second channel and the setting data.

* * * * *